United States Patent [19]

Gotman

[11] 4,347,302

[45] Aug. 31, 1982

[54] PROCESS FOR APPLYING A THIN COATING IN LIQUID FORM AND SUBSEQUENTLY DRYING IT

[76] Inventor: Alexander Gotman, 818 Fifth St., Apt. 5, Santa Monica, Calif. 90403

[21] Appl. No.: 157,185

[22] Filed: Jun. 6, 1980

[51] Int. Cl.³ .......................... B05D 5/12; B05D 3/12
[52] U.S. Cl. .................................... 430/270; 427/82; 427/240; 427/294; 427/335; 427/385.5; 427/393.6
[58] Field of Search .............. 427/240, 82, 336, 393.6, 427/294, 335, 385.5; 430/935, 270

[56] References Cited

U.S. PATENT DOCUMENTS

| | | | |
|---|---|---|---|
| 3,695,911 | 10/1972 | Polin | 427/294 |
| 3,961,100 | 6/1976 | Harris et al. | 427/335 |
| 4,022,932 | 5/1977 | Feng | 427/336 |
| 4,037,003 | 7/1977 | Maher et al. | 427/240 |
| 4,113,492 | 9/1978 | Sato et al. | 427/240 |

FOREIGN PATENT DOCUMENTS 53-33115  3/1978  Japan .................................. 430/935

*Primary Examiner*—John D. Smith
*Assistant Examiner*—Janyce A. Bell

[57] ABSTRACT

A method of coating a thin layer of a liquid material on a substrate, in which the substrate is placed in an atmosphere saturated with the vapor of a solvent for the coating material, liquid coating material is deposited on the substrate, and then the substrate is spun to disperse the coating material into a thin film while causing the excess to run off. The vaporous solvent atmosphere is maintaind while the coating and run-off are completed. Then the substrate is isolated from the source of the solvent vapor and is heated in order to dry the coating.

Apparatus for carrying out this method includes a coating chamber, a carrier adapted to receive and support the substrate, a turntable within the coating chamber for rotating the substrate carrier, and means in the coating chamber for generating the vaporous atmosphere. The apparatus also includes a separate drying chamber that is movable into or out of engagement with the coating chamber, and openings in both chambers which provide communication between them when they are in mutual engagement. Means are also provided to transfer the carrier from the coating chamber to the drying chamber, and at the same time sealing off the coating chamber to limit the amount of vaporous solvent flowing into the drying chamber.

The apparatus also includes multiple drying chambers, multiple substrate carriers normally carried in corresponding ones of the drying chambers, and means for presenting the drying chambers in succession to the coating chamber so that while a newly coated substrate is being dried the next succeeding substrate can be transferred from its drying chamber into the coating chamber for coating.

7 Claims, 7 Drawing Figures

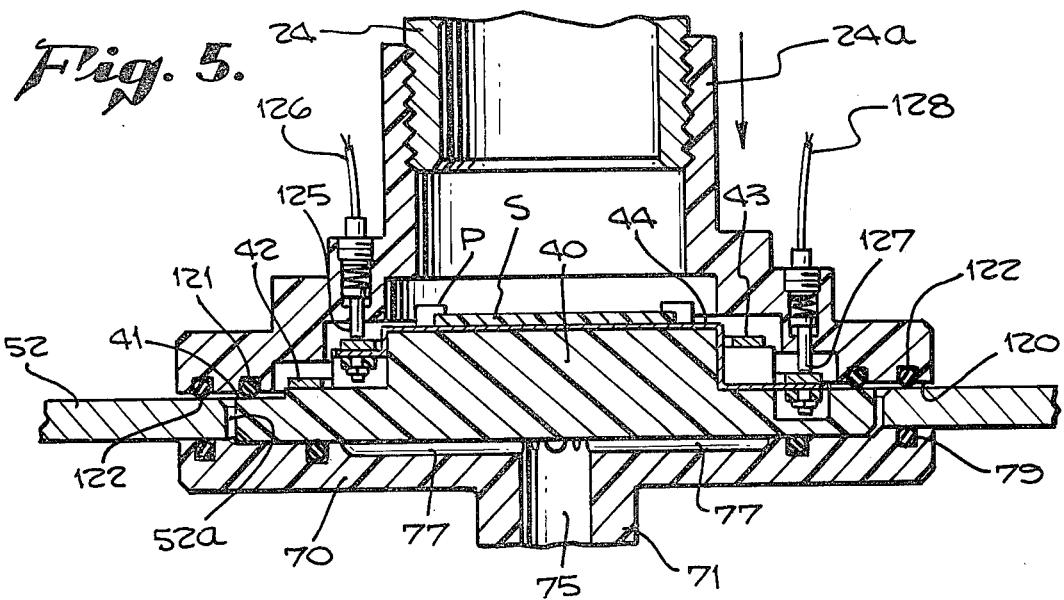
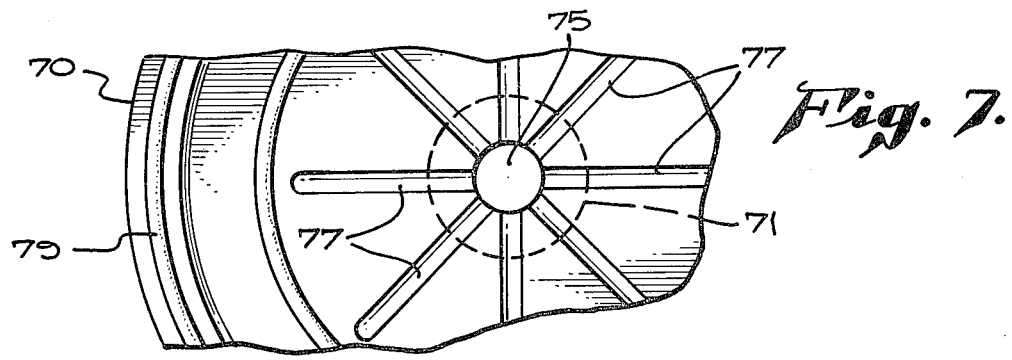
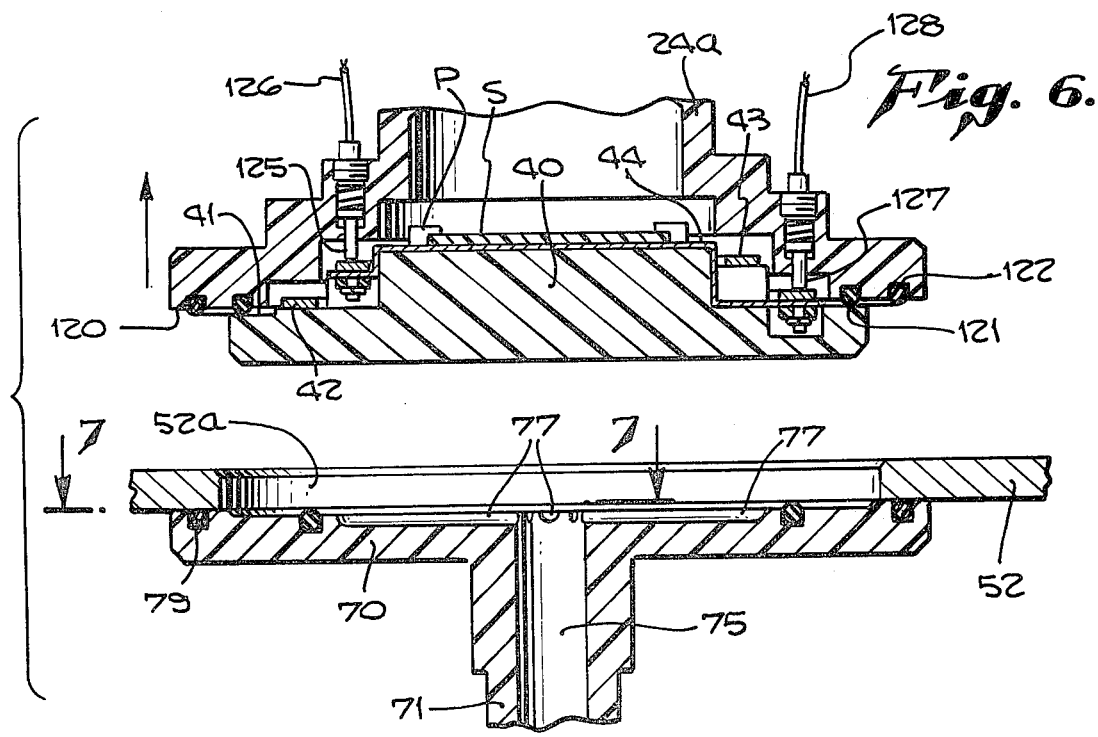

PROCESS FOR APPLYING A THIN COATING IN LIQUID FORM AND SUBSEQUENTLY DRYING IT

BACKGROUND OF THE INVENTION

The need for applying an extremely thin layer of a coating material to a substrate or work piece arises in a number of different contexts. For example, the preparation of a thin coating is an essential step in the manufacture of micro-miniature semi-conductor electronic circuits, commonly known as "chips."

It may be necessary to make such coatings very thin indeed, as for example, a thickness of one micron or less. Furthermore in the manufacture of semi-conductor products it often happens that surface portions of the semi-conductor substrate must be cut away in order to form electrical circuits having the desired characteristics. It is then necessary to apply a thin layer of photo resist material over the semi-conductor, and it is quite important that the layer of photo resist material be of uniform thickness despite the unevenness of the surface upon which it is applied.

Another of many specific problems is known, for example, as edge build up. This is a non-uniform thickness of the coating material that occurs when a spin coating process is employed. A further problem is contamination of a liquid layer.

The object and purpose of the present invention, is to provide a high speed continuous process for applying a thin uniform coating of a liquid material, and for drying the coating, together with suitable apparatus for carrying out such process.

PRIOR ART

Pertinent prior art includes the following U.S. patents:

|  |  | U.S. Class | Int. Class |
|---|---|---|---|
| Peters | 3,903,841 | 118/50 | B05 C 3/02 |
| Boeckl | 4,063,019 | 427/82 | B05 D 5/12 |
| Plows | 4,075,974 | 118/52 | B05 C 5/00 |
| Juve | 4,170,191 | 118/705 | B05 C 5/00 |
| Hubers | 4,196,231 | 427/240 | B05 D 3/12 |

SUMMARY OF THE INVENTION

According to the present invention the atmosphere surrounding the substrate is charged with the vapor of a solvent for the selected coating material, a quantity of the selected coating material is applied in liquid form to the substrate, and then the substrate is spun or rotated in order to cause radially outward movement of the liquid coating material and thereby disperse it over the entire surface of the substrate. The atmosphere of vaporous solvent causes the coating material to retain its liquid form with the result that the rotating or spinning action produces a thin coating that is entirely uniform in its thickness, in spite of a significant amount of unevenness in the surface upon which it is formed.

According to the presently preferred form of the invention an apparatus is provided which has a separate coating chamber and a separate drying chamber. The coating chamber is charged with a vaporous solvent atmosphere but the drying chamber is not. A carrier or base is provided for the substrate that is to be coated. The substrate and its carrier are first placed in the coating chamber where the coating is performed, and are then transferred to the drying chamber where the coating is dried.

As a further feature of the invention, apparatus is provided for transferring the substrate and its carrier between the two chambers without any exposure to outside atmoshere. Thus, the substrate and its coating are protected from contamination during the entire coating and drying process.

As another feature of the invention an accumulator for the liquid coating material is placed in communication with the bottom of the coating chamber. The accumulator is, therefore, in contact with the vaporous solvent atmosphere of the coating chamber. Excess coating material that runs off the substrate while the substrate and its carrier are being rotated or spun therefore remains in liquid form and is received by the accumulator without any drying action or other impairment, and hence can be complete reused.

Yet a further feature of the present invention is that it readily lends itself to a continuous and high speed production process. The presently illustrated apparatus includes provision for such a process. Specifically, multiple drying chambers are provided to work in conjunction with a single coating machine having a coating chamber. An individual drying chamber is loaded with a carrier bearing a substrate that is to be coated; the drying chamber is brought into communication with the coating chamber of the coating machine; the carrier and substrate are transferred from the drying chamber into the coating chamber; the coating operation is performed on the substrate; the carrier and newly coated substrate are transferred back to the drying chamber; drying action is initiated, and is continued while the drying chamber is being withdrawn away from the coating chamber; and then another drying chamber bearing another carrier with substrate that is to be coated is brought into communication with the coating chamber and the entire process is repeated. High speed and high efficiency of this process are achieved by virtue of the fact that each carrier together with the substrate it bears is transferred between the two chambers without substantial impairment of the vaporous solvent atmosphere inside the coating chamber. Therefore, no time need be lost in reestablishing the vaporous atmosphere.

DRAWING SUMMARY

FIG. 5 is a cross-sectional elevational view showing the substrate base during the course of its vertical movement between the coating and drying chambers;

FIG. 6 is a view like FIG. 5 but showing the substrate base after it has been lifted up from the turntable within the drying chamber; and FIG. 7 is a fragmentary top plan view of the turntable assembly taken on the line 7—7 of FIG. 6.

DETAILED DESCRIPTION

Figure 1:
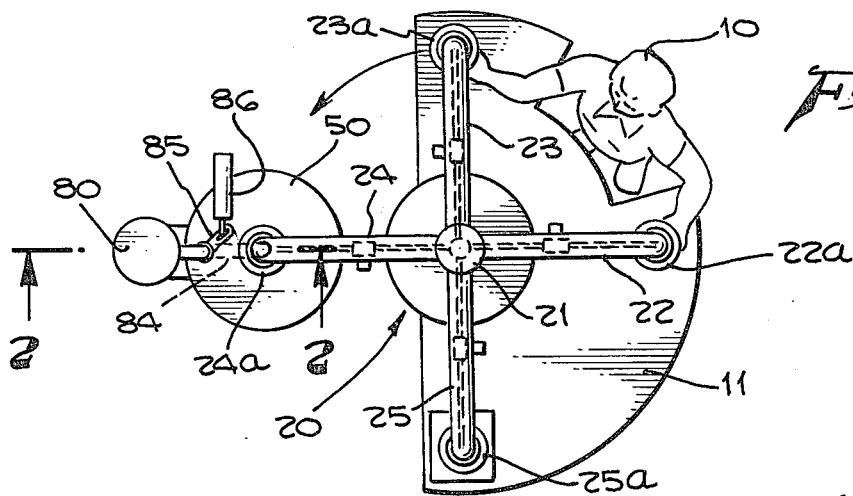
FIG. 1 is a top plan view of a continuous production machine in accordance with the present invention.

Reference is now made to FIG. 1 which illustrates generally an apparatus that is adapted for carrying out a continuous manufacturing process in accordance with the present invention. An operator 10 sits at a table 11 above which a rotating turret assembly 20 is positioned. The turret 20 is supported on a vertical shaft 21 and has four horizontal arms 22, 23, 24, 25 which are located in a common plane at the top of the shaft. Adjacent arms are separated by an angle of 90 degrees. Turret heads 22a, 23a, 24a, 25a are positioned at the ends of corresponding ones of the turret arms.

As shown in FIG. 1 the turret arms 25, 22, and 23 are positioned above the work table 11, but the work table does not extend beneath the location of turret arm 24. There is instead a coating machine 50 which is located underneath the turret head 24a.

Figure 4:
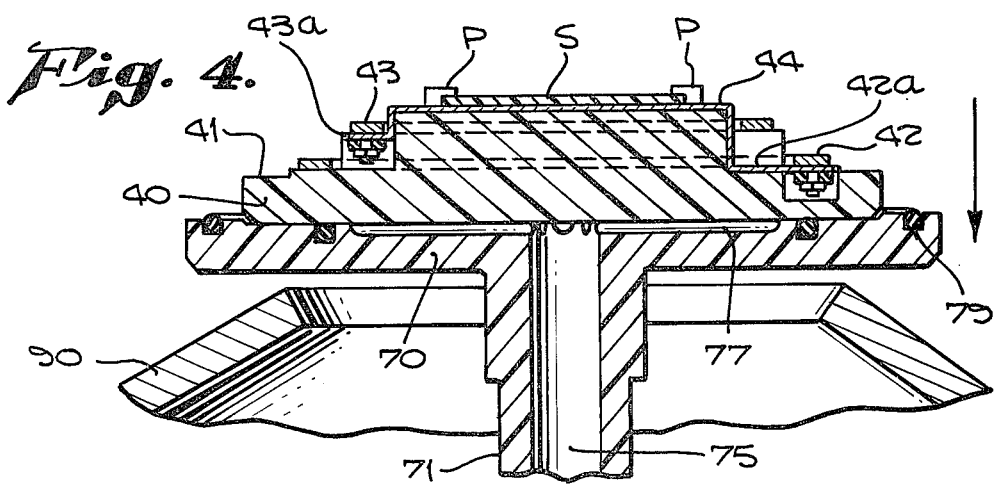
FIG. 4 is a cross-sectional elevational view of the turntable assembly and substrate base in the lower or coating position.

A substrate base or carrier 40, shown in FIGS. 4, 5, and 6, is used to support a substrate S that is to be coated. Operator 10 is provided with a continuing series of the loaded carriers 40. Each carrier or substrate base is then loaded into an empty turret head immediately to the right of where operator 10 sits. As shown in FIG. 1 this is the turret head 23a. The location of that turret head in FIG. 1 is considered to be the loading station. After that turret head is loaded the turret rotates by 90 degrees so that the newly loaded turret head then arrives at the coating machine 50. At the same time a carrier or substrate base 40 that had been coated in the coating machine, and was then removed from the coating machine, is transported by the turret through an angular movement of 90 degrees. It then arrives at the cooling station location, which is the location of turret head 25a as shown in FIG. 1. On the next rotation of the turret the carrier or substrate base at the cooling station will be moved to the unloading station, on the left of operator 10, where it will be unloaded from the turret head. As shown in FIG. 1 the unloading station is occupied by turret head 22a.

Figure 2:
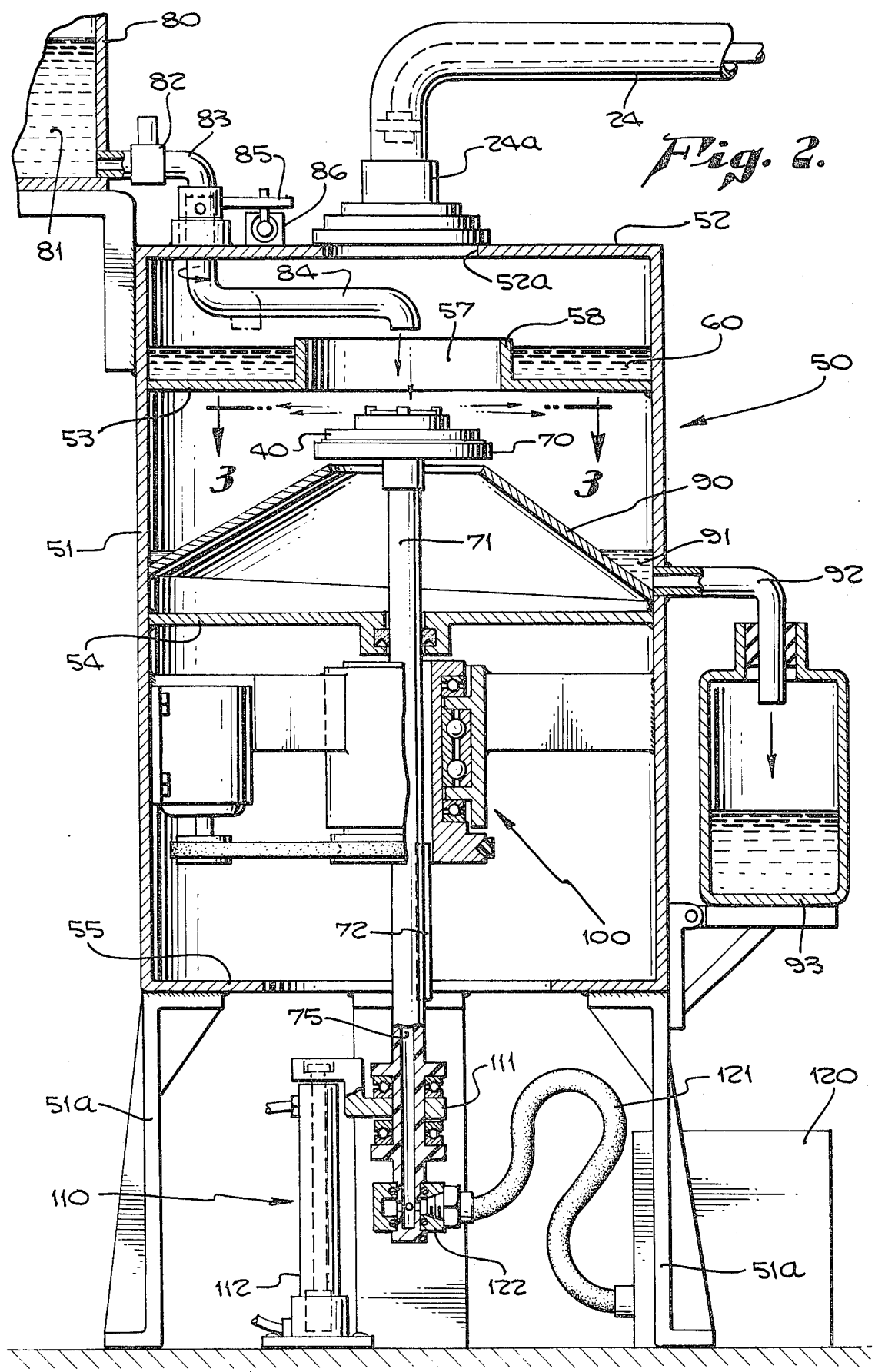
FIG. 2 is a cross-sectional elevational view taken on the line 2—2 of FIG. 1 and showing the coating and drying apparatus.

Reference is now made to FIG. 2 illustrating the coating machine 50. A housing or main frame 51 supported on legs 51a is in the form of a generally cylindrical tank and has a horizontal top wall 52, a horizontal divider wall 53 that is some distance below the top wall, another horizontal divider wall 54 at a still lower location, and a horizontal bottom wall 55. Horizontal divider 53 has a central opening 57 surrounded by a short cylindrical wall 58 that extends upward from the horizontal divider 53. A solvent bath 60 is disposed upon the upper surface of horizontal divider 53 and surrounds the stub cylinder 58.

Because of the continuous existence of the solvent bath 60 on the interior of the housing 51, the space between the top wall 52 and the horizontal divider 54 is filled with solvent in a vaporous form. More specifically in the apparatus as presently illustrated the vapor is at a saturation pressure level. The saturated vapor acts, in a sense, like rain drops, continuously catching particles of dust or contaminants inside the closed atmosphere of the housing to prevent contamination of the substrate and its coating.

An important element of the coating machine is a turntable 70 which is supported on its under side by an elongated shaft 71. The shaft 71 can be raised and lowered in order to raise or lower the turntable 70. In FIG. 2 the turntable 70 is shown in its lowered position, which is used for the coating operation. The turntable will be raised to its upper position, as shown in FIG. 5, when the carrier 40 is to be either received from the drying chamber contained in one of the turret heads or else is to be returned to that drying chamber.

A reservoir 80 holding liquid photo resist material 81 is positioned above and to the left of housing 51 as shown in FIG. 2. A valve 82 controls the flow of liquid photo resist material from the tank 80 through a tube 83 to a dispensing arm or tube 84. The lateral position of dispensing arm 84 is controlled by a retracting arm 85 which in turn is controlled by a solenoid 86. More specifically, when a coating operation is to be commenced the lower end or mouth of the dispensing arm 84 is positioned over the radial center of turntable 70 as shown in FIG. 2, and hence also over the radial center of both the carrier 40 and the substrate S. Valve 82 is then opened for a short period of time sufficient to allow the downward flow of the necessary amount of liquid photo resist material which is, therefore, deposited at the radial center of the substrate S. When this has been accomplished the solenoid 86 is operated, and acting through the arm 85 causes dispensing arm 84 to rotate in a horizontal plane and hence move completely clear of the central opening 57 through the bulkhead 53.

A collector 90 of generally conical configuration is positioned within the housing 51 and underneath the lower position of turntable 70. As shown in FIG. 2 this collector is welded to the interior wall of tank 51, and is also inclined at an angle so that its lowermost point is on the right-hand side of the tank as shown in FIG. 2. Excess liquid photo resist material 91 is collected at this point and flows outward through a permanently installed tube 92 into a bottle or container 93 that acts as an accumulator of the excess photo resist material. This excess material can therefore be reused.

Central opening 57 in bulkhead 53 is of such size that the turntable 70 can easily pass through it. This movement, though not specifically shown, occurs each time that the turntable is raised in order to receive a new carrier with accompanying substrate that requires coating, or to return a newly coated substrate with its supporting carrier to the turret head from which it was delivered.

Within the housing 51 and below the bulkhead 54 there is a rotary drive assembly generally designated as 100 which surrounds the turntable shaft 71 and imparts rotating drive to it. Any conventional construction of such rotating drive may be employed and it is not necessary to describe the specific details of the rotary drive mechanism illustrated in the present drawings.

Turntable shaft 71 extends through the bottom wall 55 of housing 51 and to the under side of the housing where a vertical drive mechanism 110 is located. The lower end of turntable shaft 71 is supported on a thrust plate 111 by means of thrust bearings which permit the rotation of the shaft relative to that plate. Plate 111 in turn may be selectively raised or lowered by the vertical drive whose principal component is a pneumatic actuator 112. Here again it is not necessary to further describe specific details of the vertical drive since any suitable mechanism may be employed for this purpose. An elongated key 72 carried by shaft 71 is engaged by the rotary drive in both raised and lowered positions of the turntable.

The carrier or substrate base 40 is secured in its desired position by means of vacuum. Two separate vacuum systems are utilized, one in the coating machine 50 and the other in the turrent 20. In general, the vacuum system inside the coating machine is utilized for holding the carrier 40 on the turntable 70 within the coating machine. The vacuum system in the turret is utilized to hold the carrier inside its associated turret head. When the carrier is being transferred from the drying chamber (turret head) to the coating chamber, or vice versa, it is necessary to release one vacuum system while bringing the other into operation. While this technique is not novel per se and would be readily understood, it will be helpful nevertheless to describe the manner in which it has been embodied in the present apparatus.

As shown in FIG. 2, a vacuum generator 120 is coupled through a hose 121 and a rotatable coupling 122 to the lower end of turntable shaft 71, which is hollow through its length. Thus as best seen in FIGS. 6 and 7 an interior passageway 75 extends to the upper end of shaft 71 and opens into a plurality of radially extending grooves 77 formed on the upper surface of turntable 70. The radial length of grooves 77 is substantially less than the radial length of substrate base or carrier 40, see FIGS. 4 and 5.

Thus when the substrate base or carrier 40 is supported on turntable 70 its lower flat surface fully covers the upper end of vacuum passageway 75 and also encloses the upper sides of all of the radial grooves 77. A vacuum sealing ring 78 is carried in a circumferential groove in the upper face of turntable 70 a short distance outside the radial extremities of the groove 77. The vacuum communicated through passageway 75 and grooves 77 pulls the carrier 40 downward against the turntable, and the seal ring 78 prevents any significant leakage of atmosphere or the solvent vapor into the vacuum system.

Turntable 70 also carries a sealing ring 79 located in a circumferential groove near its outer periphery. The top wall 52 of housing 51 has a central aperture 52a which is of sufficient diameter to permit the passage therethrough of a substrate base or carrier 40. See FIGS. 2 and 5. The relationship that exists between the parts of the machine when the carrier is being transferred between chambers is shown in FIG. 5. The outer seal ring 79 on the upper surface of turntable 70 engages the under side of housing common wall 52, thereby preventing escape of the solvent vapor from the coating chamber into the drying chamber.

Turret arm 24, FIGS. 2 and 5, has a hollow interior containing a vacuum line. The turret head 24a, FIGS. 2 and 5, is adapted to receive the carrier 40 and to retain and support it by vacuum suction. In its circumferential lower face 120, see FIG. 6, the turret head has inner and outer sealing rings 121, 122, which are similar to those on the turntable. Outer sealing ring 122 engages the upper surface of housing top 52, see FIG. 5, for preventing outside atmosphere from entering into the interior of the equipment. Inner sealing ring 121 engages an upper flat surface of carrier 40 in order to maintain the necessary vacuum suction for supporting the carrier.

Figure 3:
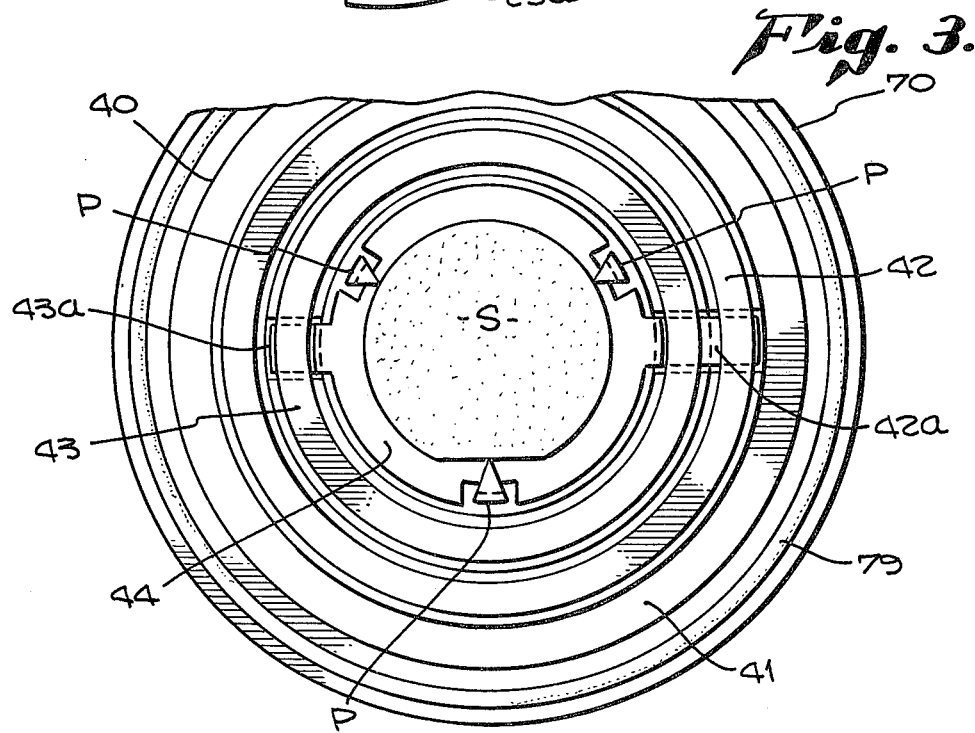
FIG. 3 is a top plan view taken on the line 3—3 of FIG. 2 showing the turntable with a substrate base carried thereon.

The carrier or substrate base 40, perhaps best seen in FIG. 4, is arranged generally in the form of a truncated cone but with stepped circumferential surfaces. Thus the first or outer flat surface 41 is adapted for sealing engagement with the sealing ring 121 of the turret head. The second and slightly higher step, not specifically identified, has a flat metal ring 42 permanently mounted thereon. The third and higher step has a flat ring 43 of still smaller diameter permanently mounted thereon. The central portion of the carrier 40 is at a still higher elevation and bears a flat heating pad 44 across its entire surface, as best seen in FIGS. 3 and 4. A connection 42a between the flat heating pad 44 and the outer contact ring 42 is made through an interior groove or recess in the upper surface of the carrier that passes underneath the inner contact ring 43. A connection 43a is also made between the inner contact ring 43 and the heating pad 44.

Turret head 24a contains a spring-mounted inner contact 125 connected to an electrical circuit wire 126. It also contains an outer spring-mounted contact 127 connected to an electrical circuit wire 128. When the carrier 40 is fully received within the turret head the spring contacts 125, 127 engage the electrical contact rings 43, 42, respectively. At the appropriate time electrical energy is supplied to the conductors 126, 128 which therefore results in the passage of electrical current through the heating pad 44, producing a heating action on the upper surface of the carrier 40.

The substrate S is generally a very thin wafer of semiconductor material whose thickness has been exaggerated for purpose of the present drawings. Substrate S is positioned on the upper flat surface of the heating pad 44, see FIG. 3. It is held in place by a set of three pins or stops P which are placed at 120 degree intervals around its circumference. Each pin has a sharp vertical edge which engages the lateral edge surface of the substrate, but the pin does not pass over the upper surface of the substrate. In FIGS. 4 and 6, for example, the drawings would seem to indicate that the pins P do pass over the upper surface of the substrate, but in fact they do not, as clearly appears from FIG. 3.

Thus it will be seen that the substrate S may be placed upon the carrier 40 which will transport it throughout the coating and drying process. Then the substrate with its complete coating can be removed from the carrier, which is ready to receive another substrate for repeating the process.

OPERATION

In operating the production machine of FIG. 1 the turret 20 is rotated progressively in the same direction, but one step at a time. The turret is also raised and lowered accompanying each step of rotation. The turret is raised in order to ring the carrier 40 out of aperture 52a as well as provide a clearance space above the chamber top wall 52. In raising the turret the seal between the turret head and the machine housing is broken at a sealing ring 122, but the vacuum seal with the carrier 40 remains in effect at the seal 121. At this time the turntabe 70 remains in engagement with wall 52 on its under side, in order to protect the solvent atmosphere inside the housing.

When a new carrier with substrate to be coated is brought into position the turret is then lowered so that the associated turret head engages the wall 52. The vacuum suction delivered from the turret arm is interrupted in order to release the carrier from the turret head. Vacuum is supplied to the turntable from vacuum generator 120. The turntable is then dropped down to its lower position.

The next step is to rotate the dispensing arm 84 to its operative position as shown in FIG. 2. Then valve 32 is operated for releasing a quantity of photo resist on the surface of substrate S. Then rotary drive 100 is actuated in order to rotate the turntable. When coating a semiconductor wafer the turntable may, for example, be rotated at about 3,000 revolutions per minute for approximately one minute. Then rotating drive is turned off.

Dispensing arm 84 has in the meantime been moved out of the way. Turntable 70 is now raised until it engages the upper wall 52 of the housing as shown in FIG. 5. A limited amount of the solvent vapor is captured in the drying chamber at this time. At this time the electrical circuit 126, 128 may be energized so as to heat the substrate and thereby commence drying the coating. The vacuum supplied to the turret head is restored, thus causing the solvent vapor in the drying chamber to be sucked out, and producing a drying action which assists the action of electrical circuit 126, 128 in drying the coating. Vacuum supply to the turntable is cut off. The turret is now raised, taking the carrier 40 and coated substrate S with it. The drying operation may be continued for some time after the carrier has been removed from the coating machine.

The time required to load a carrier into the coating machine, coat the substrate, and then remove the carrier with its coated substrate, is of the order of two minutes. Thus the machine is capable of coating quite a number of substrates per hour in a continuous process. If it is desired to extend the drying time then the turret may be provided with a greater number of arms, so that the drying time for each substrate coating may be a fairly large multiple of the time that the substrate actual spends in the coating machine.

The invention has been described in considerable detail in order to comply with the patent laws by providing a full public disclosure of at least one of its forms. However, such detailed description is not intended in any way to limit the broad features or principles of the invention, or the scope of patent monopoly to be granted.

What is claimed is:

1. In a method wherein a liquid coating material is applied to the surface of a substrate while the substrate is being spun in order to provide a thin coating on its surface, and wherein the coating is subsequently dried, the improvement comprising:
   (a) selecting a coating chamber;
   (b) charging the atmosphere of the coating chamber with a solvent for the coating material in a saturated vaporous form;
   (c) placing the substrate inside the coating chamber;
   (d) then depositing a quantity of the liquid coating material upon one surface of the substrate;
   (e) rotating the substrate about a self-contained vertical axis so as to radially disperse the liquid and thereby form a coating of uniform thickness on the substrate, by virtue of the saturated atmosphere which prevents any drying action upon the coating;
   (f) then selecting a drying chamber and, without exposing the interior of the coating chamber to outside atmosphere, placing the drying chamber in communication with the coating chamber so that the saturated atmosphere then occupies both chambers;
   (g) moving the coated substrate from the coating chamber into the drying chamber;
   (h) then independently sealing the drying chamber so as to retain both coated substrate and saturated atmosphere therein; and
   (i) thereafter initiating a drying action in the drying chamber so as to eliminate the saturated atmosphere therein while also drying the coating.

2. A method of applying a coating material in liquid form to a surface of a substrate so as to achieve a coating thereon which when dried is of uniform thickness, comprising the steps of:
   surrounding the surface with a solvent in a saturated vaporous form so as to prevent any drying action and at the same time centrifuging the substrate; and
   then when the centrifuging action is completed producing a drying action so as to remove the vaporous solvent and thus dry the coating.

3. The method of claim 2 wherein the substrate is first coated and centrifuged in a coating chamber, and is thereafter dried in a separate drying chamber.

4. The method of claim 3 wherein a solvent bath is maintained in the interior of the coating chamber.

5. The method of claim 2 wherein the coating material is a liquid photo resist material.

6. The method of claim 5 wherein excess liquid photo resist material that flows off the substrate during centrifuging is collected in a separate container.

7. The method of claim 2 wherein the drying action is produced by a combination of heat and vacuum.

* * * * *